(12) United States Patent
Agostinelli

(10) Patent No.: US 7,501,578 B2
(45) Date of Patent: Mar. 10, 2009

(54) ELECTRIC CONDUCTORS

(75) Inventor: Paolo Agostinelli, Venice (IT)

(73) Assignees: Paolo Agostinelli, Venezia (IT); St. Francis of Assisi Foundation, White Plains, NY (US)

( * ) Notice: Subject to any disclaimer, the term of this patent is extended or adjusted under 35 U.S.C. 154(b) by 0 days.

(21) Appl. No.: 10/539,907

(22) PCT Filed: Dec. 17, 2003

(86) PCT No.: PCT/IB03/06245

§ 371 (c)(1),
(2), (4) Date: Jun. 17, 2005

(87) PCT Pub. No.: WO2004/055834

PCT Pub. Date: Jul. 1, 2004

(65) Prior Publication Data

US 2006/0054347 A1  Mar. 16, 2006

(30) Foreign Application Priority Data

Dec. 18, 2002  (IT) .......................... MI2002A2672

(51) Int. Cl.
*H01B 5/00* (2006.01)
(52) U.S. Cl. .................................. 174/126.1
(58) Field of Classification Search ............. 174/106 R, 174/102 R, 126.1
See application file for complete search history.

(56) References Cited

U.S. PATENT DOCUMENTS

| 2,774,063 | A | * | 5/1956 | Shockley | .................... 205/253 |
| 2,950,149 | A | * | 8/1960 | Thomson | ..................... 384/32 |
| 3,027,269 | A | * | 3/1962 | Seizo et al. | ................. 427/310 |
| 3,692,578 | A | | 9/1972 | Schreiner et al. | |
| 4,314,230 | A | | 2/1982 | Cardinal et al. | |
| 4,524,241 | A | | 6/1985 | Binder et al. | |
| 5,527,997 | A | * | 6/1996 | Saen et al. | ............... 174/126.2 |
| 5,667,849 | A | * | 9/1997 | Carey et al. | ................. 427/431 |
| 5,939,215 | A | | 8/1999 | Andler | |
| 6,399,885 | B1 | | 6/2002 | Agostinelli | |
| 2002/0144910 | A1 | * | 10/2002 | Takeshita et al. | ............ 205/300 |

FOREIGN PATENT DOCUMENTS

| DE | 220915 A1 | 4/1985 |
| EP | 0481493 A2 | 4/1992 |
| EP | 0481493 A3 | 1/1993 |
| JP | 61-023737 A | 2/1986 |
| JP | 61-154790 A | 7/1986 |
| JP | 61-190058 A | 8/1986 |
| JP | 2000-156450 | * 6/2000 |

OTHER PUBLICATIONS

International Search Report of PCT/IB03/06245, dated Jun. 3, 2004.
International Preliminary Examination Report of PCT/IB03/06245, dated Jun. 1, 2005.

* cited by examiner

*Primary Examiner*—Chau N Nguyen
(74) *Attorney, Agent, or Firm*—Abelman, Frayne & Schwab

(57) ABSTRACT

Electric wires are described consisting of a metallic wire able to conduct the electric current, the outer surface of which is coated in an alloy consisting of specific metals in set quantities.

18 Claims, 2 Drawing Sheets

ELECTRIC CONDUCTORS

CROSS-REFERENCE TO RELATED APPLICATIONS

This application is a 371 of PCT/IB2003/006245, filed on Dec. 17, 2003.

FIELD OF THE INVENTION

The present invention refers to the field of electric wires.

STATE OF THE ART

The transmission of small and variable electric signals, like audio signals for example, is proving to be a much more complex phenomenon than known to the state of the art since in transmission of the electric signals, phenomena occur that are audible to the listener although they cannot be identified instrumentally, such as timbre, spatiality and harshness of the sound.

The distortion in high frequency or packing in medium audio frequency, caused by the copper used for the production of traditional electric wires, is audible and is immediately perceived by the silver wiring.

To overcome the above problem, the U.S. Pat. No. 6,399,885 describes cables consisting of a number of wires, positioned in series or in parallel, each one made of a different metal (in particular gold, copper or silver), said wires being insulated from each other and wrapped in a dielectric sheath.

Despite the validity of these wires they are obviously difficult to implement at industrial level given the necessary presence of gold and the manufacturing problems they entail.

Another solution consists in the application of filters or compensating networks in order to compensate for the various timbres or distortions produced by the metals of the components and wiring. The results are not completely satisfactory, however, and distortions remain which cannot be eliminated and which are perceived by the listener.

Hence the importance of eliminating the above negative factors associated with pure metals in view of the fact that the use of silver alone produces a very clear non-distorted sound but is rather faint and decidedly too metallic.

SUMMARY OF THE INVENTION

It has surprisingly been found that it is possible to solve the problem in an entirely satisfactory manner by means of metal wires, on the surface of which an alloy is deposited consisting of appropriate metals in set percentages.

Furthermore, it has been found that the wires as described and claimed in the present application not only perfectly solve the above-mentioned frequency distortion problem but also permit other applications in which the purity of transmission of the electric signal is essential for obtaining excellent final performance.

DETAILED DESCRIPTION OF THE INVENTION

Figure 1:
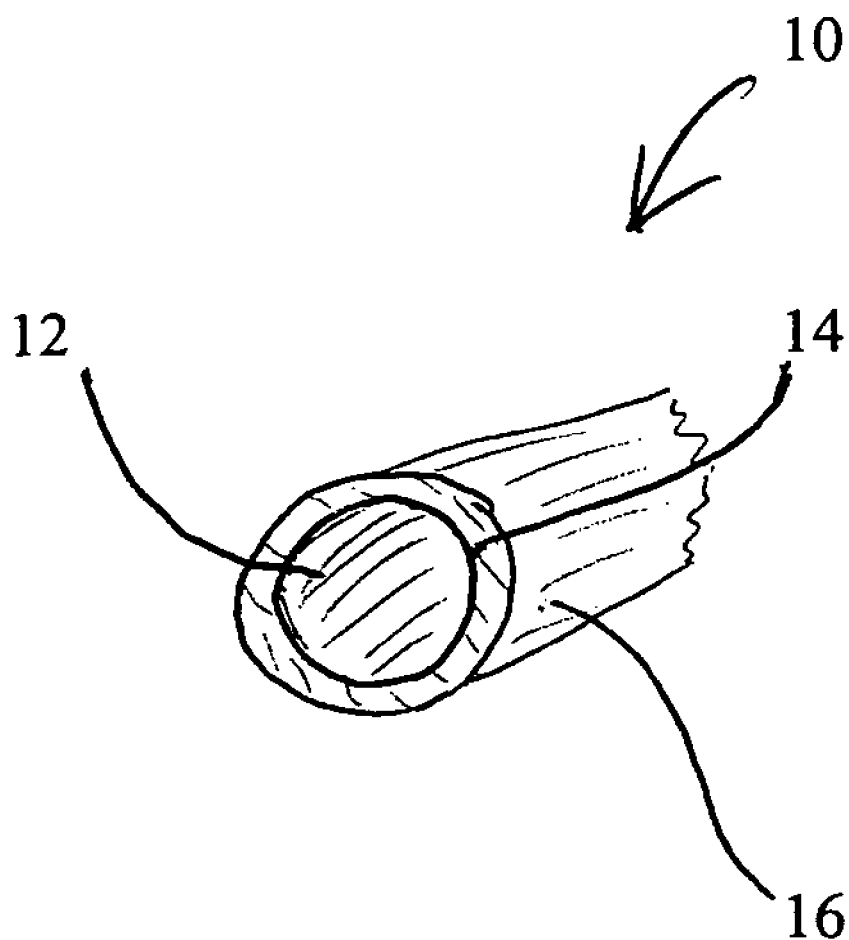
FIG. 1 is a schematic of the wire of the present invention.

The wires 10 according to the invention are shown in FIG. 1 and consist of a normal metal wire 12 able to conduct the current, for example a copper wire, the outer surface 14 of which is covered in an alloy 16 containing tin, antimony and copper.

Preferably the various metals constituting the alloy 16 are present in the following concentrations:

| | |
|---|---|
| Tin | from 74% to 98.9% |
| Antimony | from 1% to 10% |
| Copper | from 0.1% to 25% |

More preferably the alloy 16 according to the invention consists of Tin 95%, Antimony 4%, Copper 1%.

Normally the qualities of the wire 10 increase as the thickness of the alloy layer increases.

Figure 2:
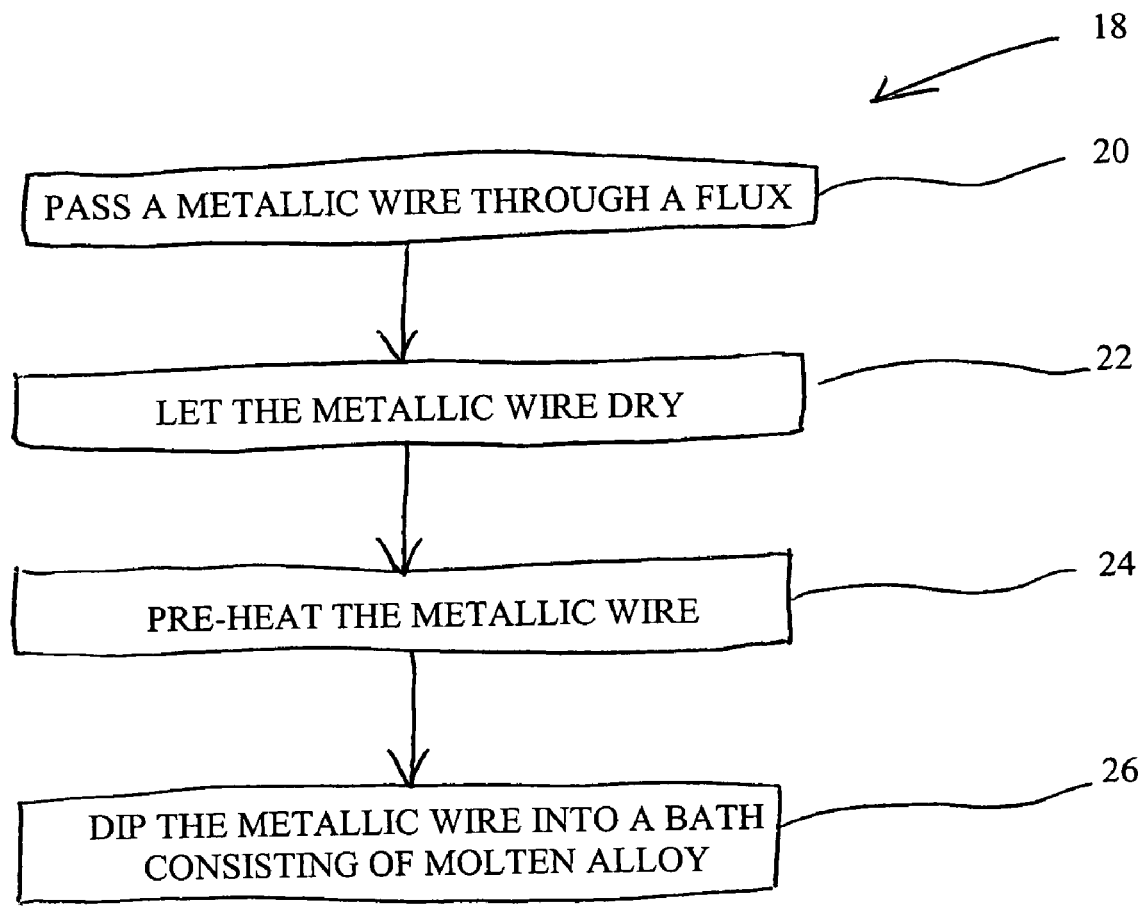
FIG. 2 is a flowchart of a process for fabricating the wire of FIG. 1.

To obtain a wire 10 according to the invention, the fabrication process 18 shown in FIG. 2 is performed, in which the metallic wire 12 is passed through a flux in step 20 and left to dry in step 22, pre-heated in step 24, and then dipped in a bath consisting of the molten alloy in step 26. The metallic wire 12 is dipped in a bath consisting of the molten alloy 16 in step 26. Obviously the time the metallic wire 12 is left in the bath will depend on the temperature of the bath, the type of metal constituting the metallic wire 12 and its dimensions in order to permit deposit of the alloy 16 on the metallic wire 12 without the latter melting or being damaged by immersion for too long at an excessively high temperature.

If, for example, the wire is 0.40 mm in diameter, a bath with temperature between 300° C. and 450° C. is used, and the wire immersion time is approximately three seconds.

Before being dipped in the molten alloy bath, the metallic wire is preferably passed through a flux, of the type normally used in the welding of electrical material or in the manufacturing of electric circuits, for example rosin, and then left to dry; the flux improves adhesion of the molten alloy to the wire.

If preferred, before immersion in the alloy bath, the wire is pre-heated, for example to a temperature between 60° and 90° C.

Examples of production of wires according to the invention are given below.

EXAMPLE 1

A copper wire, diameter 0.40 mm, is passed through rosin and left to dry; the wire is then pre-heated to 60°-80° C.

The wire is then dipped, at a speed of 3 m/min., in a crucible containing a molten alloy consisting of tin (95%), antimony (4%) and copper (1%) at a temperature of approximately 400° C.; the immersion time is approximately 3 seconds.

The wire, on which a layer of alloy is deposited, is then left to cool.

EXAMPLE 2

Example 1 is repeated using a 0.90 mm wire and dipping it at a speed of approximately 3.3 cm/sec., maintaining the alloy bath at a temperature of approximately 400° C.

Tests performed with wires produced according to the above examples show that the resolution increases considerably since in the audio or video field for example, the parameters linked to it increase: ambience, microcontrast and colour.

The wires according to the invention are suitable for a very wide range of uses, not only as connection cables for low level signals but also for connection cables for power supply, for printed circuit tracks, for coupling, signal, impulse and power transformers, for dipole, array and microstrip antennae, for connectors for signals or power supply and for electromagnetic screens.

In particular the invention refers to a power transformer, for electric distribution network, of analogue, digital and pulse signals and/or a coupling transformer, the windings of which are made of wires as described above.

Preferably the dielectric sheath used for the transformer according to the invention is made of black silk, preferably woven over the wire itself.

In particular, said transformers permit increase of the dynamics in audio signals, reducing the power supply noise; they also permit increase of the microinformation and ambience and change of the timbre in both recording and reproduction systems; said phenomena are also obtained in coupling transformers.

Using the power transformer with video systems, there was an increase in the colour and contrast and a reduction in noise.

Transformers for digital signals produced with wires as described above have provided much better results than those produced with other wire materials in the above parameters.

The invention claimed is:

1. Electric wire consisting of:
a core composed of copper and having a cylindrical wire shape and able to continually conduct a current longitudinally along the length of the cylindrical wire shape, the outer surface of the copper core being covered in a layer of alloy consisting of tin, antimony and copper through dipping in a bath of molten alloy consisting of tin, antimony and copper.

2. Wire according to claim 1 in which said alloy consists of: tin 74%-98.9%, antimony 1%-10% and copper 0.1%-10%, said quantities being expressed in weight.

3. Wire according to claim 2 in which said alloy consists of: tin 95%, antimony 4% and copper 1%, said quantities being expressed in weight.

4. Use of a wire according to claim 1 for the production of connection cables for low level signals, connection cables for power supply, printed circuit tracks and coupling, signal, pulse and power transformers, dipole, array and microstrip antennae, connectors for signals or power supply and for electromagnetic screens.

5. Transformer according to claim 4 including a dielectric sheath made of black silk, woven over the wire itself.

6. The wire of claim 1, wherein the wire is incorporated into a device selected from the group consisting of connection cables for low level signals, connection cables for power supply, printed circuit tracks, coupling transformers, signal transformers, pulse transformers, and power transformers, dipole antennae, array antennae, and microstrip antennae, and connectors for signals or power supply and for electromagnetic screens.

7. Power transformer for electric distribution network, the windings of which comprise the wire according to claim 1.

8. Electric wire consisting of:
core copper and having a cylindrical wire shape and able to continually conduct a current longitudinally along the length of the cylindrical wire shape, the outer surface of the copper core being covered in a layer of alloy consisting of: tin 74%-98.9%, antimony 1%-10% and copper 0.1%-10%, the quantities of tin, antimony, and copper being expressed in weight, with the layer of alloy being formed on the conducting metal through dipping in and removal from a bath of molten alloy consisting of: tin 74%-98.9%, antimony 1%-10% and copper 0.1%-10%, the quantities of tin, antimony, and copper being expressed in weight.

9. Wire according to claim 8 in which the alloy consists of: tin 95%, antimony 4% and copper 1%, the quantities of tin, antimony, and copper being expressed in weight.

10. Use of a wire according to claim 8 for the production of connection cables for low level signals, connection cables for power supply, printed circuit tracks and coupling, signal, pulse and power transformers, dipole, array and microstrip antennae, connectors for signals or power supply and for electromagnetic screens.

11. The wire of claim 8, wherein the wire is incorporated into a device selected from the group consisting of connection cables for low level signals, connection cables for power supply, printed circuit tracks, coupling transformers, signal transformers, pulse transformers, and power transformers, dipole antennae, array antennae, and microstrip antennae, and connectors for signals or power supply and for electromagnetic screens.

12. Power transformer for electric distribution network, the windings of which comprise the wire according to claim 8.

13. Transformer according to claim 12 including a dielectric sheath made of black silk, woven over the wire itself.

14. A method for forming an electric wire, the method comprising the steps of:
providing a core composed of copper and having a cylindrical wire shape and able to continually conduct a current longitudinally along the length of the cylindrical wire shape;
dipping the conducting metal into a bath of molten alloy consisting of: tin about 74% to about 98.9%, antimony about 1% to about 10%, and copper about 0.1% to about 10%, the quantities of tin, antimony, and copper being expressed in weight; and
removing the dipped conducting metal from the bath, thereby forming a layer of the alloy consisting of tin, antimony and copper on the outer surface of the copper core to form the electric wire.

15. The method according to claim 14, wherein the alloy consists of: tin about 95%, antimony about 4%, and copper about 1%, the quantities of tin, antimony, and copper being expressed in weight.

16. The method according to claim 14, wherein the bath has a temperature between about 300° C. and about 450° C.

17. The method according to claim 14, further comprising, before the step of dipping, the steps of:
passing the conducting metal through a flux; and
pre-heating the conducting metal to a temperature between about 60° C. and about 90° C.; and
wherein the step of dipping is performed for about three seconds.

18. The method according to claim 14, further comprising the step of:
forming the wire into a device selected from the group consisting of connection cables for low level signals, connection cables for power supply, printed circuit tracks and coupling, signal, pulse and power transformers, dipole, array and microstrip antennae, connectors for signals or power supply and for electromagnetic screens.

* * * * *